(12) United States Patent
Tanaka et al.

(10) Patent No.: US 7,488,408 B2
(45) Date of Patent: Feb. 10, 2009

(54) TIN-PLATED FILM AND METHOD FOR PRODUCING THE SAME

(75) Inventors: Hisahiro Tanaka, Fukuoka (JP); Shigeki Ogata, Kasuga (JP)

(73) Assignee: Panasonic Corporation, Osaka (JP)

(*) Notice: Subject to any disclaimer, the term of this patent is extended or adjusted under 35 U.S.C. 154(b) by 359 days.

(21) Appl. No.: 11/184,079

(22) Filed: Jul. 19, 2005

(65) Prior Publication Data

US 2006/0016694 A1 Jan. 26, 2006

(30) Foreign Application Priority Data

Jul. 20, 2004 (JP) .................. P.2004-211317
Sep. 3, 2004 (JP) .................. P.2004-257232

(51) Int. Cl.
C25D 5/50 (2006.01)
C25D 3/30 (2006.01)

(52) U.S. Cl. ............... 205/223; 205/225; 205/226; 427/123; 427/337; 427/383.7; 428/647; 428/929

(58) Field of Classification Search ............ None
See application file for complete search history.

(56) References Cited

U.S. PATENT DOCUMENTS 5,384,204 A * 1/1995 Yumoto et al. ............ 428/626
5,849,424 A * 12/1998 Sugawara et al. ......... 428/674
2001/0049027 A1* 12/2001 Endo et al. ............... 428/607
2003/0129441 A1* 7/2003 Hara et al. ............... 428/647
2005/0109631 A1* 5/2005 Kwon et al. .............. 205/191
2005/0269673 A1* 12/2005 Sugioka .................. 257/666

FOREIGN PATENT DOCUMENTS

| JP | 57-0145353 | * | 9/1982 |
| JP | 61-266597 | * | 11/1986 |
| JP | 05-033187 | * | 2/1993 |
| JP | 2001-073186 | * | 3/2001 |

* cited by examiner

Primary Examiner—John J Zimmerman
(74) Attorney, Agent, or Firm—Dickinson Wright PLLC

(57) ABSTRACT

The present invention has an object to provide a tin-plated film and a method for producing the same, capable of preventing whiskers from being generated and simultaneously preventing the surface of a substrate to be plated, which is not covered with a tin-plated film, from discoloring due to oxidation, by which prevention of whisker generation, suppression of whisker growth, and prevention of discoloring of a substrate to be plated are compatible with simplified operations ensuring excellent productivity. The method is provided with the steps of removing a part of a tin-plated film formed on copper or copper alloy; processing to prevent discoloring of the copper or copper alloy from which the tin-plated film is removed; and applying heat energy to the tin-plated film of the copper or copper alloy which is processed to prevent discoloring.

4 Claims, 4 Drawing Sheets

[TABLE 4]

| | EMBODIMENT 19 | COMPARATIVE EXAMPLE 7 | COMPARATIVE EXAMPLE 8 | COMPARATIVE EXAMPLE 9 |
|---|---|---|---|---|
| APPEARANCE | SEMI-LUSTER | DULL (FREE FROM LUSTER) | DULL (FREE FROM LUSTER) | DULL (FREE FROM LUSTER) |
| GRAIN DIA./MEAN (μm) | 1-5/1.7 | 3-10/5.6 | 2-8/3.8 | 5-12/7.5 |
| WHISKER EVALUATION INITIAL (x 3000) | | | | |
| WHISKER EVALUATION 30°C 2000H | | | | |
| WHISKER (μm) | 4 | 51 | 33 | 9 |
| PRIORITY ORIENTATION/XRD | (220) | (420) | (220) | (321) |
| FILM STRESS (MPa) X/Y | -2.0/-2.0 | 0.8/-18.0 | -2.9/-21.9 | 14.7/-12.2 |
| ZERO CROSS TIME (SEC.) | -1.5 | 5-10 | -3 | 5-10 |
| SUBSTRATE/FILM THICKNESS (μm) | COPPER ALLOY 194/9 | | | |

FIG. 5

[TABLE 4]

| | | EMBODIMENT 19 | COMPARATIVE EXAMPLE 7 | COMPARATIVE EXAMPLE 8 | COMPARATIVE EXAMPLE 9 |
|---|---|---|---|---|---|
| APPEARANCE | | SEMI-LUSTER | DULL (FREE FROM LUSTER) | DULL (FREE FROM LUSTER) | DULL (FREE FROM LUSTER) |
| GRAIN DIA./MEAN (μm) | | 1-5/1.7 | 3-10/5.6 | 2-8/3.8 | 5-12/7.5 |
| WHISKER EVALUATION | INITIAL (× 3000) | | | | |
| | 30°C 2000H | | | | |
| | WHISKER (μm) | 4 | 51 | 33 | 9 |
| PRIORITY ORIENTATION/XRD | | (220) | (420) | (220) | (321) |
| FILM STRESS (MPa) X/Y | | -2.0/-2.0 | 0.8/-18.0 | -2.9/-21.9 | 14.7/-12.2 |
| ZERO CROSS TIME (SEC.) | | -1.5 | 5-10 | -3 | 5-10 |
| SUBSTRATE/FILM THICKNESS (μm) | | COPPER ALLOY 194/9 | | | |

TIN-PLATED FILM AND METHOD FOR PRODUCING THE SAME

BACKGROUND OF THE INVENTION

The present invention relates to a method for producing a tin-plated film in which whiskers are hard to be generated and hard to grow, and a tin-plated film produced by using the same method.

Tin plating has been generally employed as a metallic surface processing method for ornaments, electronic components and structural parts because tin plating is inexpensive in costs, and brings about excellent durability, satisfactory appearance and an excellent soldering property.

However, it has been known that needle crystal consisting of single crystal of tin called "whiskers" are generated on a tin-plated surface. The whiskers generally are 1 through 2 μm diameter, and several micrometers through several millimeters long, which is easy to be generated particularly on a brightened tin-plated film to which a brightening agent is added. If whiskers are generated and grows in electronic components, it becomes a cause of short-circuiting in circuits or between terminals and noise generation. In particular, since recent electronic components are inclined to downsizing, high concentration, and feeble currents, generation of whiskers is apt to arise a failure or obstruction.

Therefore, in order to secure reliability of electronic components to which tin plating is applied, various methods for preventing whiskers from being generated have been developed.

For example, JP-A-55-138967 describes a "method for heating a tin-plated product in a non-oxidizing atmosphere to a temperature exceeding the melting point of tin."

JP-A-57-126992 describes a "method for quickly heating to a predetermined temperature between 180° C. and the melting point of tin at a programming rate of 5 through 100° C. per second after tin plating, and holding at the predetermined temperature within 180 seconds."

JP-A-57-145353 describes a "method for heat-treating at 70° C. through 100° C. within five hours after tin plating."

JP-A-5-33187 describes a "method for plating tin to a thickness of 0.15 μm or more, subsequently making the entire tin layer into a Cu—Sn diffusion layer with a copper base material by heat treatment, and plating tin thereon to a pure tin thickness of 0.15 through 0.8 μm."

However, the prior art technologies described above have the following problems and shortcomings.

In the technology described in JP-A-55-138967, since a substrate to be plated is heated in a non-oxidizing atmosphere, it is possible to prevent the surface of the substrate from being oxidized and discoloring. However, a facility for adjusting the atmosphere is required, and at the same time the running costs are increased. Therefore, there is a problem in that productivity is not satisfactory.

In the technology described in JP-A-57-126992, an effect of preventing whiskers from being generated on a tin-plated film can be obtained. However, if quick heating is carried out at a programming rate of 5 through 100° C. per second, there arises a problem in that the surface of a substrate not covered with a tin-plated film is oxidized and is discolored.

In the technology described in JP-A-57-145353, an effect of preventing whiskers from being generated on a tin-plated film is obtained by heating for a long period of time. However, there arises a problem in that the surface of a substrate to be plated, which is not covered with a tin-plated film, is discolored, and productivity is not satisfactory because the heating time is long.

In the technology described in JP-A-5-33187, there is a problem in that the processes are complicated and productivity is not satisfactory. Also, there is another problem in that the surface of a substrate to be plated, which is not covered with a tin-plated film, is discolored.

In addition, as described in JP-A-10-96095 and "Whisker Evaluation of Tin-plated Logic Component Leads" D. Romm and D. Abbott, (USA), Texas Instruments Application report SZZA037A, pages 7 through 10, February Issue, 2003, there is a method for making grain sizes of tin coarse, for example, 2 μm to 8 μm. However, whiskers cannot be effectively prevented.

Further, as disclosed in "X-Ray Diffraction and Whisker growth—Is there any correlation?" M. Jordan and G. Strube, (German) International Conference on Lead Free Electronics, Jun. 12, 2003, there is a method for controlling the priority orientation plane of tin crystal. However, whiskers cannot be effectively prevented as well.

SUMMARY OF THE INVENTION

The invention was developed to solve the above-described problems and shortcomings, and it is therefore an object of the invention to provide a method for producing a tin-plated film, which is capable of preventing whiskers of tin-plated films from being generated, and preventing the surface of copper or copper alloy substrate, which is not covered with a tin-plated film, from discoloring due to oxidization by simplified operations superior in productivity.

Also, it is another object of the invention to provide a tin-plated film having excellent reliability, which is able to prevent whiskers from being generated and growing.

The invention is mainly featured in that heat energy is applied, at 59 to 65 J per gram of a substrate, to a copper or copper alloy substrate having a tin-plated film formed thereon.

It is thereby possible to provide a method for producing a tin-plated film, by which a tin-plated film having high reliability, which is hard to generate whiskers, can be obtained.

In addition, the invention is mainly featured in that the method comprises the steps of: removing a part of a tin-plated film formed on copper or copper alloy; processing to prevent discoloring of the copper or copper alloy from which the tin-plated film is removed; and applying heat energy to the tin-plated film of the copper or copper alloy which is processed to prevent discoloring.

It is thereby possible to provide a method for producing a tin-plated film, by which a tin-plated film having high reliability and hard for whiskers to be generated can be obtained, and discoloring of the surface of a copper or copper alloy substrate not covered with a tin-plated film due to oxidization can be prevented.

BRIEF DESCRIPTION OF THE DRAWINGS

FIG. 5 shows Table 4 in which appearance, grain size, whisker evaluation, priority orientation, film stress and solder wettability of the tin-plated film are expressed.

DETAILED DESCRIPTION

Hereinafter, a description is given of embodiments with reference to the drawings FIG. 1 through FIG. 4.

Embodiment 1

EXPERIMENTAL EXAMPLE 1

A description is given of the invention, using an electronic component lead frame used for the PPF (PrePlated Frame) system as an example.

Figure 1:
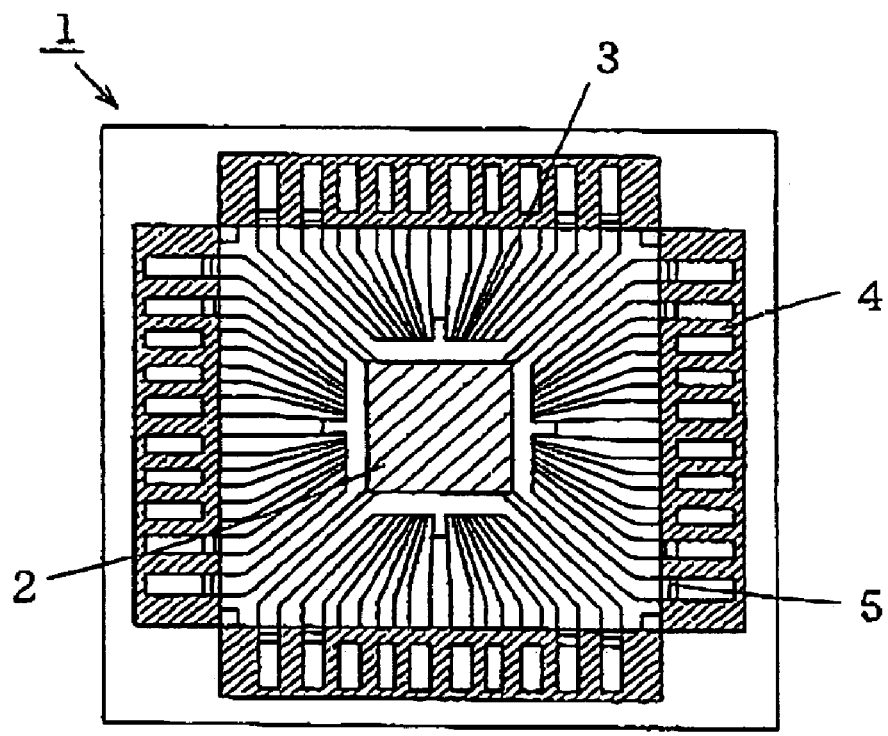
FIG. 1 is a plan view of an electronic component lead frame.
Figure 2:
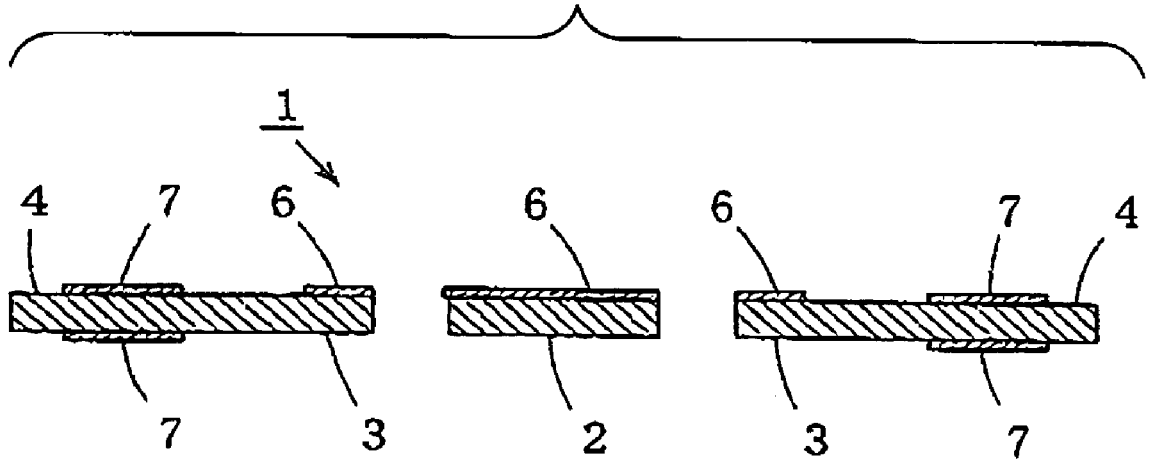
FIG. 2 is a sectional view of an electronic component lead frame.

FIG. 1 is a plan view of an electronic component lead frame, and FIG. 2 is a sectional view of an electronic component lead frame.

In the drawings, reference numeral 1 denotes a lead frame whose substrate is copper or copper alloy, 2 denotes a chip-mounted portion of the lead frame 1, 3 denotes an inner lead portion radially formed at the outer side of the chip-mounted portion 2, 4 denotes an outer lead portion extending at the outer side of the inner lead portion 3, 5 denotes a tie bar portion, 6 denotes a silver or silver alloy plated film formed on the upper surface of the chip mounted portion 2 and on the upper surface of the inside end part of the inner lead portion, and 7 denotes a tin-plated film formed on the upper surface and the lower surface of the outer lead portion 4.

Here, low tin/phosphor bronze or a precipitation hardening type copper or copper alloy, an iron/nickel alloy including nickel in iron at a ratio of approx. 42 wt % may be used as a substrate used for en electronic component lead frame. In the present embodiment, alloy 194 which is a copper alloy was used as the substrate.

When producing the lead frame 1, first, a thin plate of alloy 194 is processed to the shape of the lead frame 1. There are methods for processing the same, one of which is a punching method in which a metal die to punch out the shape of the lead frame 1 is produced, and the thin plate is punched out by a press apparatus using the metal die, and the other of which is a method in which, after photosensitive resist is coated on the surface and a pattern is baking-finished thereon, it is then developed and the photosensitive resist is left as a positive pattern of the lead frame 1, and finally processed by an etching solution of ferric chloride or cupric chloride. In the invention, any one of the pressing method and the etching method may be optionally chosen. According to the embodiment, the pressing method is employed, wherein after a plate of alloy 194 is processed to the shape of the lead frame, heat treatment is carried out as necessary via a cleaning process in order to remove stress left over in the substrate when being punched out by a press, and thereafter, a plating process is commenced.

Hereinafter, a detailed description is given of the plating process.

In the plating process, after oily constituents adhered to the substrate in the pressing process and heat-treating process are removed by using either or both of a method for immersing the substrate in an alkali de-oiling agent, etc., and an electric method (cleaning process), a copper under-layered plating is carried out to become 0.2 μm thick or more. In the embodiment, a cyanide copper solution was used as a copper under-layered plating liquid. After that, silver plating is carried out on the chip-mounted portion 2 and the inner lead portion 3 in the silver portion plating process.

Next, in order to improve adhesion between the substrate and a tin-plated film, the outer lead portion 4 on which a tin-plated film 7 is formed is preprocessed by a processing agent selected from one or two or more of hydrochloric acid, nitric acid, and sulfuric acid. In the embodiment, sulfuric acid whose concentration is 5% was used.

Following the preprocessing, partial tin plating was carried out on the outer lead portion 4 at current density of 40 A/dm$^2$. A plating solution of the partial tin plating was prepared so that MST-tin (manufactured by LEYBOLD CO., LTD) is used as metal tin at density of 50 g/L, MST-acid (manufactured by LEYBOLD CO., LTD) is used as acid at density of 75 mL/L, and MST-400 (manufactured by LEYBOLD CO., LTD) is used as an additive agent at density of 60 mL/L. A tin-plated film was formed at the outer lead portion 4 under the conditions in which the bath temperature is 50° C. and the velocity is 50 L/min. An insoluble electrodes including one or more of metals being platinum, iridium, tantalum, rhodium, ruthenium or the oxides thereof may be optionally chosen as the anode electrode. In the embodiment, an insoluble electrode having a mixture of iridium oxide and tantalum oxide coated on a substrate of titanium was used. If a soluble electrode in which a normal tin plate is employed is used, the electrode replacement is made frequent and it becomes necessary to stop the production line whenever replacement is performed, it is not preferable that the productivity is remarkably worsened. As a matter of course, where a high-speed plating method is not used, a soluble electrode anode may be used.

The tin-plating thickness may be optionally chosen in a range from 3 through 15 μm. If the tin plating thickness is made thinner than 3 μm, soldering wettability is worsened due to influences of the foundation. If the thickness is made thicker than 15 μm, it is not preferable that such an inconvenience occurs, by which resin leaks through clearance of metal dies in a sealing process of mold resin. In the embodiment, tin plating 9 μm thick was carried out.

After rinsing is carried out to sufficiently remove a plating solution after tin plating is finished, the lead frame 1 is immersed, for 20 seconds, in a sodium tertiary phosphate 12 hydrate solution (60° C.) whose density is 50 g/L, and a tin-plated film formed on the lead frame 1 was etched. Next, the lead frame 1 is immersed in a remover solution including pyrrolidine-2-carboxylic acid of 41 g/L, iminodiacetic acid of 14 g/L, glycin of 7.5 g/L, hydantoin of 10 g/L, and xylose of 3.8 g/L, and electrolysis was carried out for 15 seconds with a fixed voltage of 0.15V, using the lead frame 1 as the anode, wherein a part of the tin-plated film was electrically removed (Removing step).

The lead frame 1 was immersed in Entek Cu-56 (manufactured by Meltex Inc.) whose density is 2 mL/L after the removing step, wherein a discoloring prevention process was carried out to form an organic film on the entirety of the lead frame 1 (Discoloring prevention step), and the lead frame 1 for which the discoloring prevention step was finished was rinsed and dried.

Next, after the lead frame 1 on which a tin-plated film is formed was inputted, for 15 seconds, in a constant temperature oven whose temperature is constantly 200° C., the lead frame 1 was taken out (Heat-treatment step).

Further, in the embodiment, a lead frame 1 whose size is 26 mm×28 mm×0.15 mm and weight is 1.0 g was used, and a tin-plated film 7 was formed at an area of 10 mm×20 mm on both sides of the outer lead portion 4.

Also as shown in Table 1, it was confirmed that the lead frame 1 (copper or copper alloy substrate), having a thermocouple, whose temperature is 25° C. (room temperature) reached 146.0° C. in 15 seconds after it was inputted in a constant temperature oven whose temperature is constantly 200° C.

A test piece of Experimental Example 1 was thus obtained.

TABLE 1

| Elapsed time (Sec.) | 200° C. | 210° C. | 220° C. |
|---|---|---|---|
| 0 | 25.0 | 25.0 | 25.0 |
| 5 | 94.0 | 98.3 | 107.7 |
| 10 | 123.8 | 125.5 | 135.0 |
| 15 | 146.0 | 146.5 | 156.3 |
| 20 | 160.3 | 162.5 | 173.0 |
| 25 | 171.0 | 174.5 | 185.3 |
| 30 | 179.5 | 184.3 | 194.3 |
| 35 | 185.5 | 191.3 | 201.0 |
| 40 | 189.8 | 196.8 | 206.3 |
| 45 | 192.8 | 200.8 | 209.7 |
| 50 | 195.3 | 203.0 | 212.3 |
| 55 | 196.8 | 205.3 | 214.7 |
| 60 | 198.3 | 207.0 | 216.3 |
| 65 | 199.0 | 208.0 | 217.3 |
| 70 | 199.5 | 209.0 | 218.7 |
| 75 | 199.8 | 209.5 | 218.7 |
| 80 | 200.0 | 210.3 | 219.3 |
| 85 | 200.0 | 210.5 | 219.7 |
| 90 | 200.0 | 210.5 | 219.7 |
| 95 | 200.0 | 211.0 | 219.7 |
| 100 | 200.0 | 211.0 | 219.7 |

(Unit: ° C.)

EXPERIMENTAL EXAMPLE 2

A test piece of Experimental Example 2 was obtained as in Experimental Example 1, excepting that, as the heat treatment condition in the heat treatment step, the lead frame 1 is taken out after it is inputted, for 15 seconds, in a constant temperature oven whose temperature is constantly 210° C.

In addition, as shown in Table 1, it was confirmed that the lead frame 1 (copper or copper alloy substrate), having a thermocouple, whose temperature is 25° C. (room temperature) reached 146.0° C. in 15 seconds after it was inputted in a constant temperature oven whose temperature is constantly 210° C.

EXPERIMENTAL EXAMPLE 3

A test piece of Experimental Example 3 was obtained as in Experimental Example 1, excepting that, as the heat treatment condition in the heat treatment step, the lead frame 1 is taken out after it is inputted, for 15 seconds, in a constant temperature oven whose temperature is constantly 220° C.

Also, as shown in Table 1, it was confirmed that the lead frame 1 (copper or copper alloy substrate), having a thermocouple, whose temperature is 25° C. (room temperature) reached 156.3° C. in 15 seconds after it was inputted in a constant temperature oven whose temperature is constantly 220° C.

EXPERIMENTAL EXAMPLE 4

A test piece of Experimental Example 4 was obtained as in Experimental Example 1, excepting that, as the heat treatment condition in the heat treatment step, the lead frame 1 is taken out after it is inputted, for 30 seconds, in a constant temperature oven whose temperature is constantly 200° C.

EXPERIMENTAL EXAMPLE 5

A test piece of Experimental Example 5 was obtained as in Experimental Example 1, excepting that, as the heat treatment condition in the heat treatment step, the lead frame 1 is taken out after it is inputted, for 30 seconds, in a constant temperature oven whose temperature is constantly 210° C.

EXPERIMENTAL EXAMPLE 6

A test piece of Experimental Example 6 was obtained as in Experimental Example 1, excepting that, as the heat treatment condition in the heat treatment step, the lead frame 1 is taken out after it is inputted, for 30 seconds, in a constant temperature oven whose temperature is constantly 220° C.,

EXPERIMENTAL EXAMPLE 7

A test piece of Experimental Example 7 was obtained as in Experimental Example 1, excepting that, as the heat treatment condition in the heat treatment step, the lead frame 1 is taken out after it is inputted, for 60 seconds, in a constant temperature oven whose temperature is constantly 200° C.

Experimental Example 8

A test piece of Experimental Example 8 was obtained as in Experimental Example 1, excepting that, as the heat treatment condition in the heat treatment step, the lead frame 1 is taken out after it is inputted, for 60 seconds, in a constant temperature oven whose temperature is constantly 210° C.

EXPERIMENTAL EXAMPLE 9

A test piece of Experimental Example 9 was obtained as in Experimental Example 1, excepting that, as the heat treatment condition in the heat treatment step, the lead frame 1 is taken out after it is inputted, for 60 seconds, in a constant temperature oven whose temperature is constantly 220° C.

Comparative Example 1

A test piece of Comparative Example 1 was obtained as in Experimental Example 1 excepting that no heat treatment process is applied to the lead frame 1.

Comparative Example 2

A test piece of Comparative Example 2 was obtained as in Experimental Example 1 excepting that, as the heat treatment condition in the heat treatment step, the lead frame 1 is taken out after it is inputted, for 30 seconds, in a constant temperature oven whose temperature is constantly 220° C. and that the tin-plated film is not electrically removed by using a remover including a carboxylic acid compound, hydantoin and xylose.

Comparative Example 3

A test piece of Comparative Example 3 was obtained as in Experimental Example 1 excepting that, as the heat treatment condition in the heat treatment step, the lead frame 1 is taken out after it is inputted, for 30 seconds, in a constant temperature oven whose temperature is constantly 220° C. and no discoloring prevention step based on a organic film is carried out.

(Evaluation of Experimental Examples 1 through 9 and Comparative Examples 1 through 3)

The test pieces according to Experimental Examples 1 through 9 and Comparative Examples 1 through 3, which were thus obtained, are preserved in a constant temperature and constant humidity oven whose temperature is 30° C. and humidity is 50% RH, and the test pieces were taken out when 1000 hours elapsed, and 2000 hours elapsed, and were observed for situations of whisker generation using a scanning type electron microscope (SEM). Twenty longer whiskers were selected, and the average thereof was used.

The heat energy received by a copper or copper alloy substrate on which the tin-plated film 7 was formed was calculated by measuring a change in temperature from the room temperature (25° C.) when the processing time elapsed when the lead fame 1 having a thermocouple attached thereto was inputted in a constant temperature oven in a state where the temperature of the constant temperature oven were made constant to be 200° C., 210° C. and 220° C., respectively, and using the specific heat and weight (both are measured in advance) of the copper or copper alloy substrate on which the tin-plated film was formed. The expression is [(Specific heat)×(Change in temperature)×(Weight)].

Heat energy received by the test pieces of Experimental Example 1 through 9 and Comparative Example 1 through 3, whisker lengths in respective preservation terms, and discoloring of the copper portion of the copper or copper alloy substrate are shown in Table 2. Also, parts at which copper discoloring is not recognized are marked by O, and those at which copper discoloring was recognized are marked by X.

carried out, it was recognized that the copper part was discolored although no whiskers are generated.

EXPERIMENTAL EXAMPLE 10

A test piece of Experimental Example 10 was obtained as in Experimental Example 1, excepting that Sn-5300 (prepared by Dipsol-Chemicals Co., Ltd.) was used as a plating solution, and metal tin was prepared to density of 75 g/L, acid was prepared to density of 250 mL, and Sn-5300S was prepared to density of 40 mL/L as an additive agent, and a tin-plated film was formed under conditions in which the bathing temperature is 25° C. and velocity is 5 L/min.

EXPERIMENTAL EXAMPLE 11

A test piece of Experimental Example 11 was obtained as in Experimental Example 10, excepting that, as the heat treatment conditions in the heat treatment step, the lead frame 1 is taken out after it is inputted, for 15 seconds, in a constant temperature oven whose temperature is constantly 210° C.

TABLE 2

| | Treatment temp. (° C.) | Treatment time (sec.) | Energy (J) | Whisker length(μm) | | | Discoloring |
| --- | --- | --- | --- | --- | --- | --- | --- |
| | | | | 0 hours | 1000 hours | 2000 hours | |
| Embodiment 1 | 200 | 15 | 46.3 | 0 | 42 | 77 | o |
| Embodiment 2 | 210 | 15 | 46.3 | 0 | 40 | 72 | o |
| Embodiment 3 | 220 | 15 | 50.4 | 0 | 26 | 61 | o |
| Embodiment 4 | 200 | 30 | 59.2 | 0 | 16 | 65 | o |
| Embodiment 5 | 210 | 30 | 61.2 | 0 | 18 | 43 | o |
| Embodiment 6 | 220 | 30 | 64.9 | 0 | 0 | 0 | o |
| Embodiment 7 | 200 | 60 | 66.4 | 0 | 0 | 0 | x |
| Embodiment 8 | 210 | 60 | 69.7 | 0 | 0 | 0 | x |
| Embodiment 9 | 220 | 60 | 73.3 | 0 | 0 | 0 | x |
| Comparative Example 1 | No heat treatment given | | 0 | 0 | 32 | 51 | o |
| Comparative Example 2 | 220 | 30 | 64.9 | 0 | 0 | 0 | x |
| Comparative Example 3 | 220 | 30 | 64.9 | 0 | 0 | 0 | x |

As shown in Table 2, although, in Experimental Examples 6 through 9 and Comparative Example 2 and 3, no whisker growth was recognized in the tin-plated film, whisker growth was recognized in the Experimental Examples and Comparative Example other than the above. However, In Experimental Examples 7 through 9 and Comparative Examples 2 and 3, it was recognized that the copper part of the copper or copper alloy substrate was discolored.

Therefore, a test piece in which both prevention of whisker generation and prevention of discoloring are compatible is the test piece according to Experimental Example 6. As the heat treatment conditions in the heat treatment step in this case, the treatment temperature was 220° C. (that is, being inputted in a constant temperature oven whose temperature is constantly 220° C.), and the treatment time was 30 seconds. And the heat energy received by the lead frame (copper or copper alloy substrate) on which the tin-plated film was formed was equivalent to approx. 65 J per gram of the substrate.

Even if the heat energy per gram of the substrate, which the copper or copper substrate received is approx. 65 J as in Experimental Example 6, in the Comparative Examples 2 and 3 in which the removing step was not carried out or the discoloring prevention step based on an organic film was not

EXPERIMENTAL EXAMPLE 12

A test piece of Experimental Example 12 was obtained as in Experimental Example 11, excepting that, as the heat treatment conditions in the heat treatment step, the lead frame 1 is taken out after it is inputted, for 15 seconds, in a constant temperature oven whose temperature is constantly 220° C.

EXPERIMENTAL EXAMPLE 13

A test piece of Experimental Example 13 was obtained as in Experimental Example 10, excepting that, as the heat treatment conditions in the heat treatment step, the lead frame 1 is taken out after it is inputted, for 30 seconds, in a constant temperature oven whose temperature is constantly 200° C.

EXPERIMENTAL EXAMPLE 14

A test piece of Experimental Example 14 was obtained as in Experimental Example 10, excepting that, as the heat treatment conditions in the heat treatment step, the lead frame 1 is taken out after it is inputted, for 30 seconds, in a constant temperature oven whose temperature is constantly 210° C.

EXPERIMENTAL EXAMPLE 15

A test piece of Experimental Example 15 was obtained as in Experimental Example 10, excepting that, as the heat treatment conditions in the heat treatment step, the lead frame 1 is taken out after it is inputted, for 30 seconds, in a constant temperature oven whose temperature is constantly 220° C.

EXPERIMENTAL EXAMPLE 16

A test piece of Experimental Example 16 was obtained as in Experimental Example 10, excepting that, as the heat treatment conditions in the heat treatment step, the lead frame 1 is taken out after it is inputted, for 60 seconds, in a constant temperature oven whose temperature is constantly 200° C.

EXPERIMENTAL EXAMPLE 17

A test piece of Experimental Example 17 was obtained as in Experimental Example 10, excepting that, as the heat treatment conditions in the heat treatment step, the lead frame 1 is taken out after it is inputted, for 60 seconds, in a constant temperature oven whose temperature is constantly 210° C.

EXPERIMENTAL EXAMPLE 18

A test piece of Experimental Example 18 was obtained as in Experimental Example 10, excepting that, as the heat treatment conditions in the heat treatment step, the lead frame 1 is taken out after it is inputted, for 60 seconds, in a constant temperature oven whose temperature is constantly 220° C.

Comparative Example 4

A test piece of Comparative Example 4 was obtained as in Experimental Example 10, excepting that no heat treatment step is carried out for the lead frame 1.

Comparative Example 5

A test piece of Comparative Example 5 was obtained as in Experimental Example 10, excepting that, as the heat treatment condition in the heat treatment step, the lead frame 1 is taken out after it is inputted, for 30 seconds, in a constant temperature oven whose temperature is constantly 220° C. and that the tin-plated film is not electrically removed by using a remover including a carboxylic acid compound, hydantoin and xylose.

A test piece of Comparative Example 6 was obtained as in Experimental Example 10 excepting that, as the heat treatment condition in the heat treatment step, the lead frame 1 is taken out after it is inputted, for 30 seconds, in a constant temperature oven whose temperature is constantly 220° C. and no discoloring prevention step based on a organic film is carried out.

(Evaluation of Experimental Examples 10 through 18 and Comparative Examples 4 through 6)

The test pieces according to Experimental Examples 10 through 18 and Comparative Examples 4 through 6, which were thus obtained, are preserved in a constant temperature and constant humidity oven whose temperature is 30° C. and humidity is 50% RH, and the test pieces were taken out when 1000 hours elapsed, and 2000 hours elapsed, and were observed for situations of whisker generation using a scanning type electron microscope (SEM). Twenty longer whiskers were selected, and the average thereof was used.

Also, the heat energy received by the copper or copper alloy substrate was calculated by the same method as described with respect to the Experimental Examples 1 through 9.

The heat energy received by the Experimental Examples 10 through 18 and the Comparative Examples 4 through 6, whisker length in the respective preservation terms, and discoloring of the copper or copper alloy substrate are shown in Table 3.

TABLE 3

| | Treatment temp. (° C.) | Treatment time (sec.) | Energy (J) | Whisker length(μm) | | | Discoloring |
| | | | | 0 hours | 1000 hours | 2000 hours | |
| --- | --- | --- | --- | --- | --- | --- | --- |
| Embodiment 10 | 200 | 15 | 46.3 | 0 | 6 | 12 | ○ |
| Embodiment 11 | 210 | 15 | 46.3 | 0 | 2 | 11 | ○ |
| Embodiment 12 | 220 | 15 | 50.4 | 0 | 3 | 11 | ○ |
| Embodiment 13 | 200 | 30 | 59.2 | 0 | 0 | 0 | ○ |
| Embodiment 14 | 210 | 30 | 61.2 | 0 | 0 | 0 | ○ |
| Embodiment 15 | 220 | 30 | 64.9 | 0 | 0 | 0 | ○ |
| Embodiment 16 | 200 | 60 | 66.4 | 0 | 0 | 0 | x |
| Embodiment 17 | 210 | 60 | 69.7 | 0 | 0 | 0 | x |
| Embodiment 18 | 220 | 60 | 73.3 | 0 | 0 | 0 | x |
| Comparative Example 4 | No heat treatment given | | 0 | 0 | 7 | 8 | ○ |
| Comparative Example 5 | 220 | 30 | 64.9 | 0 | 0 | 0 | x |
| Comparative Example 6 | 220 | 30 | 64.9 | 0 | 0 | 0 | x |

As shown in Table 3, although, in Experimental Examples 13 through 18 and Comparative Example 5 and 6, no whisker growth was recognized in the tin-plated film, whisker growth was recognized in the Experimental Examples other than the above and Comparative Example 4. However, In Experimental Examples 16 through 18 and Comparative Examples 5 and 6, it was recognized that the copper part of the copper or copper alloy substrate was discolored.

Therefore, test pieces in which both prevention of whisker generation and prevention of discoloring are compatible are the test pieces according to Experimental Examples 13 through 15. As the heat treatment conditions in the heat treatment step in these cases, the treatment time was 30 seconds respectively. And, at this time, the heat energy received by the lead frame 1 (copper or copper alloy substrate) on which the tin-plated film was formed was equivalent to approx. 59 J per gram of the substrate.

Even if the heat energy per gram of the substrate, which the copper or copper substrate received is approx. 65 J as in Experimental Example 15, in the Comparative Examples 5 and 6 in which the removing step was not carried out or the discoloring prevention step based on an organic film was not carried out, it was recognized that the copper part was discolored although it was not recognized that whiskers are generated.

As described above, as in the Experimental Examples, if the lead frame on which a tin-plated film 7 was formed is provided with a step of electrically removing using a solution including a carboxylic acid compound, hydantoin and xylose, a step of processing to prevent discoloring based on an organic film, and a step for carrying out heat treatment, for 30 seconds, in a constant temperature oven whose temperature is constantly 200 through 220° C., and applying heat energy equivalent to 59 to −65 J per gram of the substrate to the tin-plated substrate, it is obvious that prevention of whisker generation and prevention of discoloring of copper parts are compatible. In addition, the heat treatment condition in the heat treatment step differs in compliance with the type of a tin-plated film, particularly, the type of a tin plating solution, and, in a tin-plated film which is hard for whiskers to be generated (in the embodiment, the cases of Experimental Examples 10 through 19 in which Sn-5300 (manufactured by Dipsol Chemicals Co., Ltd.) is used as a tin-plating solution), whiskers can be prevented from being generated with less heat energy given in comparison with a tin-plated film which is easy for whiskers to be generated (in the embodiment, the cases of Experimental Examples 1 through 9 in which MST-Tin (manufactured by Leybold CO., LTD) is used), and the range of heat treatment conditions in which copper parts are prevented from being discolored can be made wider, wherein the productivity can be increased.

In addition, in the embodiment, although a description was given of a tin-plated film on an electronic component lead frame, the invention is not limited thereto.

Also, in the embodiment, although a description was given of the case in which Sn-5300 (manufactured by Dipsol Chemicals Co., Ltd.) and MST-Tin (manufactured by Leybold CO., LTD) are used as a tin-plating solution, evaluation was made with respect to whisker length and discoloring of copper parts in connection with test pieces on which a tin-plated film was formed by using Technistan EP-JET (manufactured by Technique Inc.) and Solderon ST-300 (manufactured by Gevrey Corp.) other than the above-described tin plating solutions. As a result, the heat treatment conditions for preventing whiskers from being generated and copper parts from being discolored in the case of using these tin-plating solutions were intermediate between the heat treatment conditions of the Experimental Example using Sn-5300 (manufactured by Dipsol Chemicals Co., Ltd.) and the heat treatment conditions of the Experimental Example using MST-Tin (manufactured by Leybold CO., LTD). Accordingly, it is obvious that the method for producing a tin-plated film according to the invention is not applicable only to a specified tin-plated film but is applicable to general tin-plated films 7, wherein its universality is excellent.

Embodiment 2

In Embodiment 2, a description is given of an electronic component lead frame used for the PPF (PrePlated Frame) system.

Figure 3:
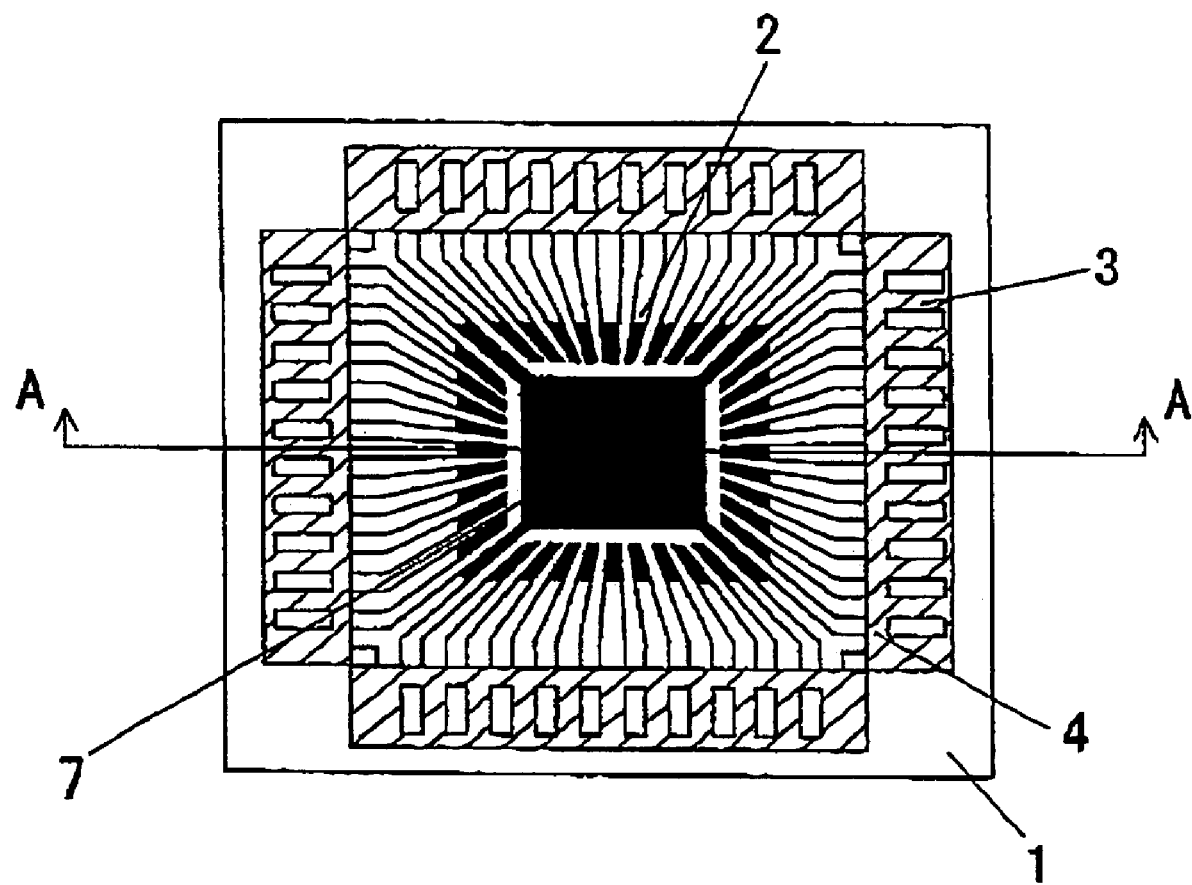
FIG. 3 is a plan view of an electronic component lead frame according to Embodiment 2.
Figure 4:
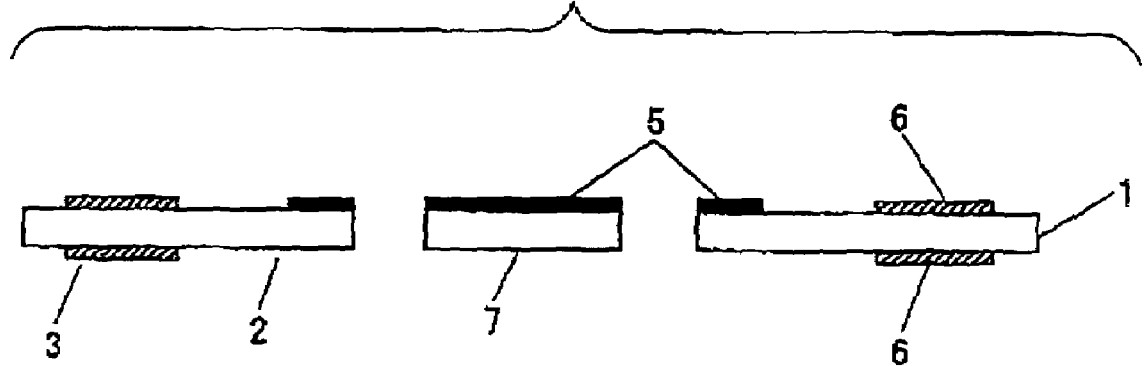
FIG. 4 is a sectional view of an electronic component lead frame according to Embodiment 2.

FIG. 3 is a plan view showing an electronic component lead frame according to Embodiment 2, and FIG. 4 is a sectional view showing an electronic component lead frame according to Embodiment 2. FIG. 4 depicts a section taken along the line A-A in FIG. 1.

In FIG. 3 and FIG. 4, reference numeral 1 denotes a substrate, 2 denotes an inner lead portion, 3 denotes an outer lead portion, 4 denotes a tie bar portion for connecting outer lead portions 3 adjacent to each other, 5 denotes a silver-plated layer, 6 denotes a tin-plated layer, and 7 denotes a chip-mounted portion.

Although the substrate 1 according to Embodiment 2 corresponds to a metal substrate of the invention, a metal substrate according to the invention includes both of a metal substrate in which the substrate 1 itself such as a lead frame is concurrently used as a support substrate of the electronic components thereof and a metal substrate which is formed on an insulation substrate formed of resin like a metal film of a wiring plate. That is, a metal substrate according to the invention may construct a support substrate of electronic components by itself, and may be provided with a support substrate of a separate member and be formed on the corresponding support substrate.

Here, various types of metals and alloys may be used as the substrate 1 used for an electronic component lead frame. However, preferably, low tin/phosphor bronze or a precipitation hardening type copper or copper alloy, an iron/nickel alloy including nickel in iron at a ratio of approx. 42 wt % may be used. In particular, since a combination of copper or copper alloy and tin plating causes remarkable generation of whiskers, a tin-plated film according to the invention is preferably applied to cases where the metal substrate is copper or a copper alloy.

First, a thin plate of the substrate 1 is processed to the shape of a lead frame. There are methods for processing the same, one of which is a punching method in which a metal die to punch out the shape of the lead flame is produced, and the thin plate is punched out by a press apparatus using the metal die, and the other of which is a method in which, after photosensitive resist is coated on the surface and a pattern is baking-finished thereon, it is then developed and the photosensitive resist is left as a positive pattern of the lead frame 1, and finally processed by an etching solution of ferric chloride or cupric chloride. In the invention, any one of the pressing method and the etching method may be optionally chosen.

After the substrate 1 is processed to the shape of a lead frame, the substrate is subjected to a heat treatment step as necessary via a rinsing step, whereby stress left over in the substrate 1 when being punched out by a press machine is removed. After that, the lead frame is subjected to a plating step.

Hereinafter, a detailed description is given of a plating step according to the invention.

After oily constituents adhered to the substrate 1 in the pressing process and heat-treating process are removed by using either or both of a method for immersing the substrate in an alkali de-oiling agent, etc., and an electric method, a copper under-layered plating is carried out to become 0.2 μm thick or more. A cyanide copper solution may be used as a copper under-layered plating liquid.

After that, silver plating is carried out on the inner lead portion 2 by the partial silver plating step. And, as shown in FIG. 4, the silver-plated layer 5 is formed. Also, Embodiment 1 shows a case where the silver plating layer 5 is also formed on the chip-mounted portion 7 as shown in FIG. 4. However, no silver-plating layer 5 may be formed on the chip-mounted portion 7.

And, after partial silver plating is carried out, in order to improve adhesion between the substrate 1 and a tin-plated layer 6 described later, the substrate 1 of the outer lead portion 3 is processed by a treatment agent selected from one or two or more of hydrochloric acid, nitric acid, and sulfuric acid.

After the pretreatment, partial plating of tin is carried out on the outer lead portion 3, And, as shown in FIG. 4, a tin-plated layer 6 is formed.

Here, with respect to the plating solution, tin protoxide may be used as metal tin, and alkyl sulphonic acid may be used as acid. A surface active agent is added to the mixture as an additive agent. In addition, it is preferable that a nonionic surface active agent is used as the surface-active agent.

Also, by adjusting the conditions such as the bathing temperature, velocity and further current density, a tin-plated film (tin-plated layer 6) is formed on the substrate 1.

Further, as an anode electrode used for tin plating, an insoluble electrodes including one or more of metals being platinum, iridium, tantalum, rhodium, ruthenium or the oxides thereof may be optionally chosen as the anode electrode. It is preferable that an insoluble electrode having a mixture of iridium oxide and tantalum oxide coated on a substrate of titanium is used. If a soluble electrode in which a normal tin plate is employed is used, the electrode replacement is made frequent and it becomes necessary to stop the production line whenever electrode replacement is performed, it is not preferable that the productivity is remarkably worsened. As a matter of course, where a high-speed plating method is not used, a soluble electrode anode may be used.

The tin-plating thickness may be optionally chosen in a range from 3 through 15 μm. If the tin plating thickness is made thinner than 3 μm, soldering wettability is lowerd due to influences of the foundation. If the thickness is made thicker than 15 μm, it is not preferable that such an inconvenience occurs, by which resin leaks through clearance of metal dies in a sealing process of mold resin.

After rinsing is carried out to sufficiently remove a plating solution after tin plating is finished, the tin-plated surface is etched by an immersion process employing, for example, sodium tertiary phosphate/12-hydrate.

Next, for example, using a solution including pyrrolidine-2-carboxylic acid, iminodiacetic acid, glycin, hydantoin, and xylose, the entirety of the lead frame is electrically removed, and discoloring prevention treatment is carried out by an organic film. Thereafter, rinsing and drying are carried out.

And, after the plating step is completed, the electronic component lead frame is heated, and an annealing process is carried out on the tin-plated film (tin-plated layer 6) form on the substrate 1.

With the above steps, the crystallization of the tin-plated film formed on the substrate 1 is oriented on the plane (220) with priority, and at the same time, after the tin-plated film was formed, the film stress becomes more than −7.2 MPa but less than 0 MPa Also, preferably, in regard to the film stress, a difference in film stress in two directions orthogonal to each other at the same measuring portion is 1.0 MPa or less, the size of the tin grains of the tin-plated film is 1 μm or more but 5 μmm or less and the mean grain size is 2 μm or less. Or, the crystallization of the tin-plated film formed on the substrate 1 is oriented on the plane (220) with priority, the size of tin grains of the tin plate film is made into 1 μm or more but 5 μmm or less and the mean grain size is made into 2 μm or more.

Hereinafter, a description is given of examples of the second embodiment of the invention.

EXAMPLE 19

In Example 19, as shown in FIG. 3 and FIG. 4, plating was carried out on an electronic component lead frame. First, an alloy 194 which is a copper alloy is employed in example 19 as a substrate used for an electronic component lead frame. At the beginning, a thin plate of the alloy 194 is processed to the shape of a lead frame.

In example 19, after a plate of the alloy 194 was processed to the shape of the lead frame by a press method, the plate was then subjected to a heat treatment step as necessary after a rinsing step, whereby stress left in the substrate when it is punched by a press is removed. Thereafter, a plating step is commenced.

Hereinafter, a detailed description is given of the plating step of example 19.

Oily substances adhered to the substrate in the pressing step and heat treatment step are removed with an alkali de-oiling agent, etc., by concurrent use of an immersion method and an electric method or independent use thereof in the rinsing step. After that, copper under-layered plating is formed to be 0.2 μm or more. A cyanite copper solution is used as a copper underlayered plating solution. After that, an inner lead portion is plated with silver in the partial silver plating step.

After the partial silver plating is carried out, a substrate of an outer lead portion is processed in order to improve the adhesion of the substrate to the tin-plated layer. A sulfuric acid solution whose concentration is 5% was used for pre-processing in example 19.

After the pre-processing, partial tin plating is carried out on the outer lead portion to current density of 40 A/dm$^2$.

The plating solution was prepared so that a mixture of tin protoxide and alkyl sulphonic acid was used as metal tine at a ratio of 75 g/L, an alkyl sulphonic acid solution was used as acid at a ratio of 250 mL/L, and a nonionic surface active agent is used as a surface-active agent at ratio of 40 mL/L.

A tin-plated film was formed under the conditions of a bathing temperature of 25° C. and a velocity of 5 L/min. In Embodiment 1, an insoluble electrode having a mixture of iridium oxide and tantalum oxide coated on a substrate of titanium was used as the anode electrode. And, tin plating 9 μm was carried out in Embodiment 1.

After rinsing is carried out to sufficiently remove a plating solution after tin plating is finished, the lead frame 1 is immersion-processed, for 20 seconds, in a sodium tertiary phosphate/12 hydrate solution, whose density is 50 g/L, at 60° C., and a tin-plated film was subjected to an etching step. Next, using a remover solution including pyrrolidine-2-carboxylic acid of 41 g/L, iminodiacetic acid of 14 g/L, glycin of 7.5 g/L, hydantoin of 10 g/L, and xylose of 3.8 g/L, and the entirety lead frame was electrically removed with a fixed voltage of 0.15V for 15 seconds. Entek Cu-56 (manufactured by Meltex Inc.) whose density is 2 mL/L was used for 15 seconds to execute a discoloring prevention process based on an organic film. After that, rinsing and drying were carried out.

The tin-plated film thus obtained was preserved in an environment whose temperature is 30° C. and relative humidity is 50% RH, and it was taken out when 2000 hours elapsed. Whisker generation was observed by using a scanning type electron microscope (SEM).

An X-ray diffraction apparatus (XRD: JDX-8030, manufactured by JEOL Corporation) was used for measurement of the priority orientation plane, and the measurement was made at a scanning range of 30° through 80°, measurement time of 1 second per step, and step width of 0.1°.

Measurement of film stress was carried out by an X-ray diffraction method using a PSPC minute part X-ray stress measurement apparatus (manufactured by RIGAKU DENKI Co., Ltd.), and the measurement was made for two orthogonal directions of the same measurement portion using a sin 2ψ method. The position of the measurement was the middle portion of an outer lead 0.5 mm wide, wherein the lengthwise direction is made into X direction and the width direction is made into Y direction. Also, the measurement was carried out in compliance with the X-ray stress measurement standards regulated by the X-ray material strength department committee of the Japan Material Society, wherein a test piece which was preserved at 10° C. or less after a plated film was formed was used, and the stress was prevented from changing due to formation of an Sn—CU alloy layer till the measurement. In Embodiment 1, using data of the Sn(420) plane when the characteristic X-ray is Cr—Kα, the side having a greater compression stress of two orthogonal directions is regarded as the film stress where it is assumed that the positive side of the stress value is the tensile stress, and the negative side is the compression stress.

With respect to the solder wettability evaluation, a solder wettability tester (Solder Checker: SWET-2100, manufactured by Taltin Co.,) was used. A tin-plated film obtained was heated to 85° C. with the relative humidity of 85% RH for 16 hours, only the outer lead portion of the lead frame was cut off, and was attached to the tester, wherein, in compliance with the solder testing method based on the equilibrium method regulated by JIS C 0053, the zero cross time was measured, which is the time when the action force is made into zero again by the soldering surface and test piece beginning to be wetted after the zero figure of the action force is subjected to a floating force at the moment when the soldering surface and test piece are brought into first contact with each other. As for flux, Lappix R (non-halogen) was used, the soldering bath is kept at 230° C., and tin-lead eutectic crystal solder was used.

EXAMPLE 20

Example 20 was carried out by a method similar to example 19, excepting that, after a lead frame on which a tin-plated film is formed was held in a constant temperature oven, whose temperature is constantly 220° C., for 60 seconds and is annealed, and the lead frame is taken out.

Comparative Example 7

As a plating solution, such a plating solution was used, in which a mixture of alkyl sulphonic acid and tin salt is used as metal tin at a ratio of 50 g/L, an alkyl sulphonic acid solution (65 wt %) is used as acid at a ratio of 75 mL/L, and an isopropyl alkohol/methanol/acqueous solution of a non-ion surface active agent and a negative ion surface active agent is prepared to density of 60 mL/L as an additive agent. A method which is the same as that of Embodiment 1 was employed, excepting that a tin-plated film was formed under the conditions being the bathing temperature of 50° C. and velocity of 5 L/min.

Comparative Example 8

As a plating solution, such a plating solution was used, in which a mixture of stannous sulfate and sulfuric acid is used as metal tin at a ratio of 45 g/L, a sulfuric acid solution (30 wt %) is used as acid at a ratio of 100 mL/L, an additive agent 1 is used at a ratio of 100 mL/L, and an additive agent 2 is used at a ratio of 20 mL/L, and a hydroquinone solution (5%) is prepared at density of 20 mL/L as an oxidization preventing agent. A method which is the same as that of Embodiment was employed, excepting that a tin-plated film was formed under the conditions being the bathing temperature of 40° C. and velocity of 5 L/min.

Comparative Example 9

As a plating solution, such a plating solution was used, in which a methanesulfonic acid tin solution is used as metal tin at a ratio of 50 g/L, a methanesulfonic acid solution (55%) is used as acid at a ratio of 210 mL/L, a surface active agent (50 wt %) is used as an additive agent at 80 mL/L, and a sulfur compound solution (15 wt %) is prepared to density of 15 mL/L as an oxidization preventing agent. A method which is the same as that of Embodiment 1 was employed, excepting that a tin-plated film is formed under the conditions being the bathing temperature of 45° C. and velocity of 5 L/min.

Comparative Example 10

The same method as that of example 19 was carried out, excepting that the condition to form a tin-plated film is current density of 10 A/dm$^2$.

Comparative Example 11

The same method as that of Comparative Example 7 was carried out, excepting that the condition to form a tin-plated film is current density of 10 A/dm$^2$.

Appearance, grain size, whisker evaluation, priority orientation, film stress and solder wettability of the tin-plated film obtained are expressed in Table 4 as shown in FIG. 5, and changes in the priority orientation and film stress based on the annealing and current density conditions are shown in Table 5.

TABLE 5

|  | Example 20 | Comparative Example 10 | Comparative Example 11 |
|---|---|---|---|
| Grain dia. Range/mean (μm) | 1~5/1.7 | 1~5/1.7 | 3~10/5.6 |
| Current density (A/dm$^2$) | 40 | 10 | 10 |
| Priority orientation plane (220° C. × 60 sec) | ○ | — | — |
| Film stress/XRD | (220) | (321) | (321) |
| Film tsress (MPa) X/Y | −6.2/−7.2 | −11.0/−29.6 | −17.3/−6.4 |
| Whisker evaluation | A | x | x |

A: No whisker generated,
x: Whisker length 30(μm) or more

Example 19 is a film in which priority is placed on solder wettability by making the grain size of tin small, and Comparative Example 7 is a film which prevention of whisker growth is intended by making the grain size of tin large. On the other hand, Comparative Example 8 is a film in which prevention of whisker growth is intended by controlling the priority orientation plane of the film.

Conventionally, it has been said that if the appearance of tin-plated films is made (dull) free from any luster, the film becomes hard for whiskers to be generated. Although Comparative Examples 7 and 9 have dull appearance, whiskers remarkably grow to be 51 μm in Comparative Example 7 after 2000 hours at 30° C. while short and thick whiskers of 9 μm grow in Comparative Example 9. However, although Example 19 has dull appearance, whisker growth is small to be 4 µm. That is, whisker growth is not determined only on the basis of grain sizes and luster of the plated film. Although, in Comparative Example 8 and Example 19, the priority orientation plane of the film is the same (220) plane, whiskers remarkably grow to be 33 µm in Comparative Example 8. Comparative Examples 7 and 9 presents priority orientation on a crystallization plane other than the (220) plane. Remarkable whiskers grow in Comparative Example 1 while thick and short whiskers grow in Comparative Example 9. The whisker growth is not determined only on the basis of the priority orientation plane.

With respect to the relationship between the magnitude of compression stress of a film that was preserved at 10° C. or less till measurement of the film stress after plating and whiskers, since Example 19 in which whisker growth was the least to be 4 µm presents stress of −2.0 MPa, next, Comparative Example 9 in which whisker growth was 9 µm presents stress of −12.2 MPa, Comparative Example 8 in which whisker growth was 33 µm presents stress of −21.9 MPa, and Comparative Example 7 having the greatest whisker growth presents stress of −18.0 MPa, it can be observed that a film having greater stress has a tendency of whiskers to be apt to grow. An area of tensile stress in which the film stress is positive is not preferable in view of that adhesion with the substrate is worsened since the film itself is going to contract.

On the other hand, an area of compression stress in which the film stress is negative is preferable in view of that the film itself is going to be elongated inversely of compression, and is made into such a shape by which the substrate is held in. However, if the compression stress is increased as described above, it is apt to become a cause of whisker generation. Therefore, the range of film stress in which adhesion with a substrate is satisfactory and whiskers are hard to grow is −2.0 MPa through 0 MPa in the area of compression stress.

Also, as shown in Table 5, if the current density is lowered to 10 A/dm$^2$, the priority orientation plane changes as in Comparative Example 10, and the compression stress remarkably increases to be −29.6 MPa, wherein whiskers are apt to grow, and the priority orientation plane greatly changes although the compression stress does not greatly change as in Comparative Example 11. Contrarily, although not being illustrated, where the current density is increased to be 50 A/dm$^2$ or more, whiskers are apt to be generated as in the case where the current density is lowered. That is, there is a close relationship between the whisker growth and the current density.

As in Example 20, although the film subjected to annealing at 220° C. does not cause whiskers to be generated, the compression stress slightly increases due to formation of a Sn—Cu alloy due to annealing. It is considered that this occurs since the Sn—CU alloy layer is formed with priority in the form of Cu$_3$Sn by annealing, and diffusion of copper elements to a tin film changes from grain boundary diffusion to bulk diffusion. Therefore, the film stress at which adhesion with the substrate is favorable was in an area ranging from −7.2 MPa to 0 MPa in the range of compression stress.

Further, when a difference in the film stress measured in two orthogonal directions (X direction and Y direction) at the same measurement portion is less than 1.0 MPa, the situation is the most favorable where no whisker generation. The smaller the tin grain becomes and the higher the luster thereof becomes, the better the solder wettability is made. In the embodiment, suppression of the whisker growth and solder wettability are compatible.

As described with respect to Embodiments 1 and 2, when forming a tin plating layer on a lead frame made of copper or a copper alloy, by adequately adjusting the solution temperature, current density and velocity in compliance with the composition of a plating solution, a tin-plated film is priority-oriented on the (220) plane, the compression stress of a plated film obtained is made small in an area from −7.2 MPa to 0 MPa, the grain size range of tin grains of the plated film is 1 µm through 5 µm, and the mean grain size is made 2 µm or less, wherein the whisker growth can be prevented.

Also, although a detailed mechanism is not clear, the composition of the plating solution includes a nonionic surface active agent, and tin plating is carried out under the conditions that the bathing temperature is lower than 40° C., for example, 25° C., the current density is greater than 10 A/dm$^2$ but less than 50 A/dm$^2$, for example, 40 A/dm$^2$, wherein the crystallization orientation plane of the tin-plated film is priority-oriented on the (220) plane, and at the same time, the film stress becomes more than −7.2 MPa but less than 0 MPa after the tin-plated film was formed. Or it is possible to achieve that the crystallization orientation plane of the tin-plated film is priority-oriented on the (220) plane, the size of tin grains of the tin-plated film is 1 µm or more but 5 µm or less, and the mean grain diameter is made 2 µm or less.

Therefore, with respect to a tin-plated film formed on a copper or copper alloy-made lead frame, a difficulty of whisker growth is not determined only on the basis of the appearance luster and priority orientation plane. The whisker growth can be suppressed even if the compression stress is increased due to formation of Sn—CU alloy layer (Cu$_6$Sn$_5$) if the priority orientation plane is provided on a plated film of the (220) plane, and the compression stress is small immediately after the plating is finished. In addition, since the film stress does not greatly change due to annealing, an Sn—Cu alloy layer is formed with priority in the form of Cu$_5$Sn, and diffusion of copper elements changes from grain boundary diffusion to bulk diffusion, it is considered that such an action is brought about, by which it becomes hard for whiskers to grow.

In the above embodiments, a description was given a tin-plated film onto an electronic component lead frame. However, other tin-plated films, etc., which are formed on a metal film of various types of wiring boards such as FPC, etc., may be listed. The present invention is not limited to the applications described above.

Further, it is naturally possible that a tin-plated film described in Example 20 is produced by a method for producing a tin-plated film according to Example 19.

That is, for those in which the crystallization orientation plane of a tin-plated film is priority-oriented on a (200) plane, and the film stress is made greater than −7.2 MPa but lower than 0 MPa after the tin-plated film is formed, annealing can be given thereto by applying heat energy of 59 to 65 J per grain of a substrate.

Accordingly, such effects can be brought about, by which it is possible to prevent whiskers from being generated, and furthermore the whisker growth can be suppressed even if whiskers are generated.

What is claimed is:

1. A method for producing a tin-plated film comprising:
    applying heat energy of 59 to 65 J per gram of a substrate to a copper or copper alloy substrate, on which a tin-plated film is formed; and
    removing a part of a tin-plated film formed on a copper or copper alloy substrate and treating to prevent discoloring of the copper or copper alloy substrate, from which the tin-plated film is removed, prior to the step of applying the heat energy, wherein:

the heat energy is applied to the tin-plated film of the copper or copper alloy substrate for which the discoloring preventing treatment is carried out.

2. The method for producing a tin-plated film according to claim 1, wherein, in the removing step, the tin-plated film is removed by using a remover including (a) carboxylic acid compound and (b) one or more of hydantoin and pentose.

3. The method for producing a tin-plated film according to claim 2, wherein the carboxylic acid compound is one or more of pyrrolidine-2-carboxylic acid, iminodiacetic acid, and glycin.

4. A tin-plated film produced by the method for producing a tin-plated film according to claim 1.

* * * * *